United States Patent
Chiu

(10) Patent No.: US 10,169,225 B2
(45) Date of Patent: Jan. 1, 2019

(54) MEMORY SYSTEM AND MEMORY-CONTROL METHOD WITH A PROGRAMMING STATUS

(71) Applicant: Silicon Motion, Inc., Jhubei (TW)

(72) Inventor: Shen-Ting Chiu, Houlong Township (TW)

(73) Assignee: Silicon Motion, Inc., Jhubei (TW)

(*) Notice: Subject to any disclaimer, the term of this patent is extended or adjusted under 35 U.S.C. 154(b) by 218 days.

(21) Appl. No.: 14/604,358

(22) Filed: Jan. 23, 2015

(65) Prior Publication Data
US 2016/0217067 A1    Jul. 28, 2016

(51) Int. Cl.
| G06F 12/00 | (2006.01) |
| G06F 12/02 | (2006.01) |
| G11C 16/10 | (2006.01) |
| G06F 13/16 | (2006.01) |
| G11C 16/34 | (2006.01) |

(52) U.S. Cl.
CPC .......... *G06F 12/0246* (2013.01); *G11C 16/10* (2013.01); *G11C 16/102* (2013.01); *G06F 13/16* (2013.01); *G06F 2212/1016* (2013.01); *G06F 2212/7207* (2013.01); *G06F 2212/7208* (2013.01); *G11C 16/3459* (2013.01)

(58) Field of Classification Search
CPC .... G06F 3/0607; G06F 3/0631; G06F 3/0688; G06F 3/0689; G06F 12/0246; G06F 13/16
See application file for complete search history.

(56) References Cited

U.S. PATENT DOCUMENTS

| 5,742,792 A * | 4/1998 | Yanai ................... G06F 3/0601 710/1 |
| 6,044,444 A * | 3/2000 | Ofek ................... G06F 11/2066 710/1 |
| 7,606,940 B2 * | 10/2009 | Yamagami .............. G06F 3/067 707/999.201 |
| 2005/0033827 A1 | 2/2005 | Yamagami |

* cited by examiner

*Primary Examiner* — Matthew Bradley
(74) *Attorney, Agent, or Firm* — Wang Law Firm, Inc.

(57) ABSTRACT

A memory system with a programming status is provided. The memory includes at least one first memory, at least one second memory and a controller. Each of the at least one first memory includes a plurality of memory regions to store data. Each of the at least one second memory includes a plurality of memory regions for programming the data from the at least one first memory. The controller is coupled to the second memory and utilized to record a programming status of the data. Whether the programming is successful or not is checked when the at least one first memory or the at least one second memory is going to be implemented by inquiring the programming status, and the at least one first memory stores the data until the programming is checked to be successful.

20 Claims, 8 Drawing Sheets

MEMORY SYSTEM AND MEMORY-CONTROL METHOD WITH A PROGRAMMING STATUS

BACKGROUND OF THE INVENTION

Field of the Invention

The present invention relates to a memory system and a memory-control method including a programming status, and in particular it relates to check the programming result of the memory system by utilizing the programming status.

Description of the Related Art

Memory devices and memory systems are widely used in various kinds of electronic devices. Regarding the programming of data for a memory device, the programming results are inspected or checked as soon as the data is programmed to the memory device. However, it takes a long checking time to check the programming result. In particular, the controller or the firmware of the electronic device may be occupied executing the checking of the programming result during the checking time. Accordingly, the functions of the firmware or the controller would stop or postponed until the checking of the programming result is finished. As such, it may waste too much time and result in abrupt-decaying performance for the electronic device.

Therefore, a highly efficient and dynamically adjusted memory-control method and its memory system are needed to prevent the electronic device from abrupt-decaying performance by utilizing the programming status.

BRIEF SUMMARY OF THE INVENTION

In an embodiment of the invention, a memory system with a programming status is provided. The memory includes at least one first memory, at least one second memory and a controller. Each of the at least one first memory includes a plurality of memory regions to store data. Each of the at least one second memory includes a plurality of memory regions for programming the data from the at least one first memory. The controller is coupled to the second memory and utilized to record the programming status of the data. Whether the programming is successful or not is checked when the at least one first memory or the at least one second memory is going to be implemented by inquiring the programming status, and the at least one first memory stores the data until the programming is checked to be successful. The programming status includes information about the data, information about the at least one first memory and its memory region where the data is programmed from, and information about the at least one second memory and its memory region where the data is programmed to.

In an embodiment of the invention, a memory-control method with a programming status is provided. The memory-control method includes recording a programming status of the data which is programmed from at least one first memory to at least one second memory; checking whether the programming is successful or not when the at least one first memory or the at least one second memory is going to be implemented by inquiring the programming status; and storing the data in the at least one first memory until the programming is checked to be successful. The programming status includes information about the data, information about the at least one first memory and its memory region where the data is programmed from, and information about the at least one second memory and its memory region where the data is programmed to.

A detailed description is given in the following embodiments with reference to the accompanying drawings.

BRIEF DESCRIPTION OF THE DRAWINGS

For a more complete understanding of the illustrative embodiments and the advantages thereof, reference is now made to the following descriptions taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
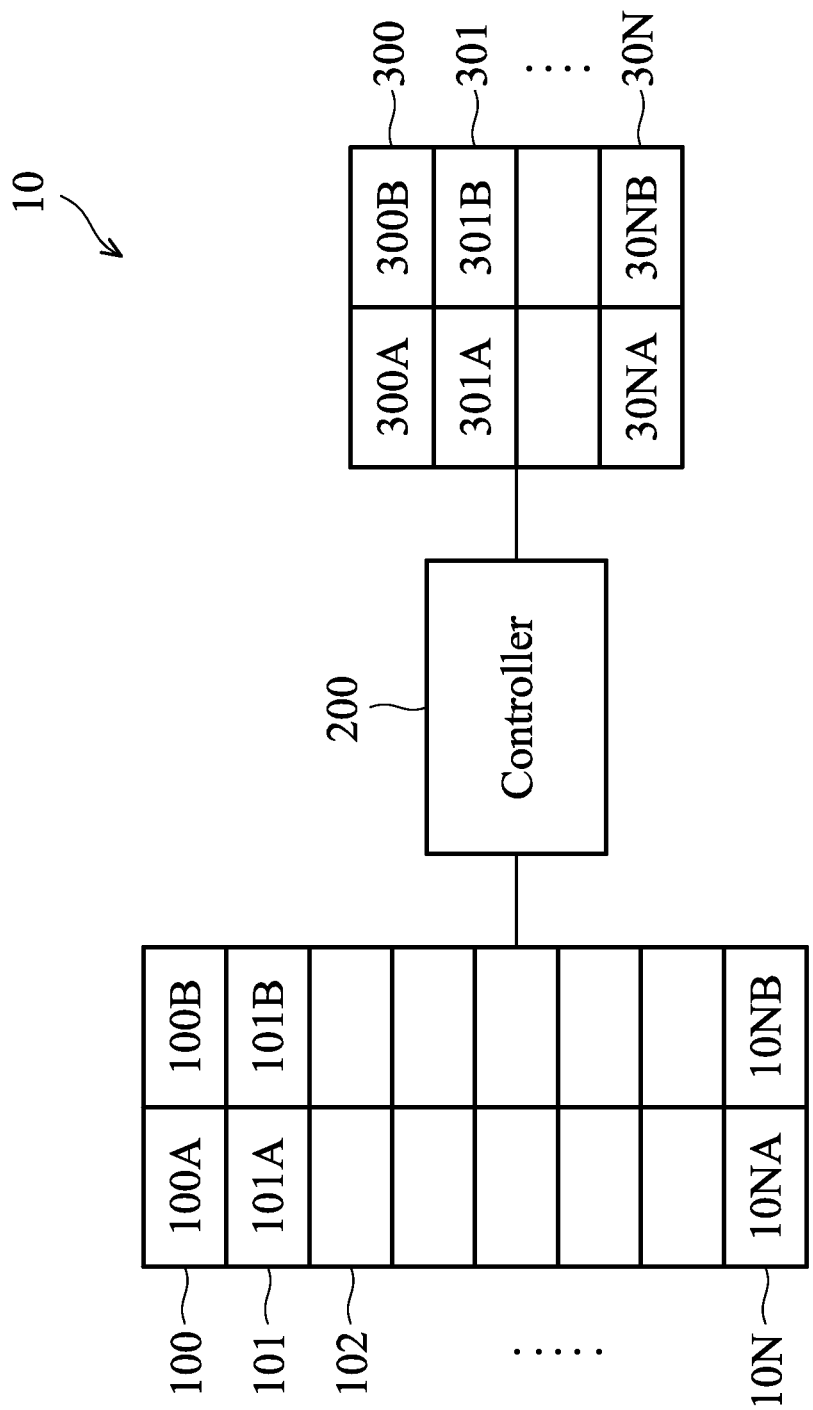
FIG. 1 is a schematic diagram of the memory system according to one embodiment of the present invention.

FIG. 1 is a schematic diagram of the memory system 10 according to one embodiment of the present invention. The memory system 10 includes at least one first memory 100~10N, a controller 200 and at least one second memory 300~30N. For example, the first memories 100~10N are random-access memories (RAMs), and the second memories 300~30N are NAND memories. As shown in FIG. 1, each of the at least one first memory 100~10N includes a plurality of memory regions to store data, and each memory region could include a plurality of blocks. For example, the first memory 100 includes the memory regions 100A and 100B for storing data, and the first memory 10N includes the memory regions 10NA and 10NB for storing data. In addition, each of the at least one second memory 300~30N includes a plurality of memory regions for programming the data from the at least one first memory 100~10N, and each memory region could include a plurality of blocks. For example, the second memory 300 includes the memory regions 300A and 300B for programming data, and the second memory 30N includes the memory regions 30NA and 30NB for programming data. In another example, the second memories 300~30N could be different dies of a memory device. In a further illustration, the controller 200 could include the firmware of the memory system 10. As another example, the controller 200 may comprise a micro-controller and a read-only memory (ROM) stored with firmware codes. The micro-controller may execute the firmware codes to access or operate the second memories 300~30N. Specifically, the controller 200 reads or writes the second memories 300~30N. It should be noted that in some embodiments, the controller 200 could further record, inquire and/or update the programming status of the second memories 300~30N.

As shown in FIG. 1, the controller 200 is coupled to the second memory 300~30N and is utilized to record the programming status of the data. More specifically, the data is stored in the first memory 100~10N and programmed to the second memory 300~30N. It should be noted that whether the programming is successful or not is checked when the at least one first memory 100~10N or the at least one second memory 300~30N is going to be implemented by inquiring the programming status. In other words, the programming result is not inspected or checked as soon as data is programmed to the memory device. The programming result is checked just before the at least one first memory 100~10N or the at least one second memory 300~30N is going to be implemented or accessed. Therefore, a long checking time which is caused by checking the programming result as soon as the data is programmed is avoided, and a better performance is obtained accordingly. In addition, the at least one first memory 100~10N stores the data until the programming is checked to be successful. As such, when the programming fails, the data stored on the first memory 100~10N can be the source to recover or support the programming. For example, the data stored on the first memory 100~10N can be programmed again to the second memory 300~30N.

In one embodiment, the programming status recorded by the controller 200 includes information about the data, information about the at least one first memory 100~10N and its memory region where the data is programmed from, and information about the at least one second memory 300~30N and its memory region where the data is programmed to. More specifically, the programming status further includes information about the block of the at least one second memory 300~30N where the data is programmed to. Furthermore, the programming status is updated when the at least one first memory 100~10N or the at least one second memory 300~30N has been implemented or when the programming status has been inquired. The controller 200 records the programming status as soon as the data is programmed from the first memory 100~10N to the second memory 300~30N, but it does not check the programming results with the programming status until at least one first memory 100~10N or the at least one second memory 300~30N has been implemented. Since the controller 200 records the basic information about the programming without checking and inspection in this stage, recording the programming status would only take a short time to prevent the memory system 10 from sacrificing the performance.

Figure 2A:
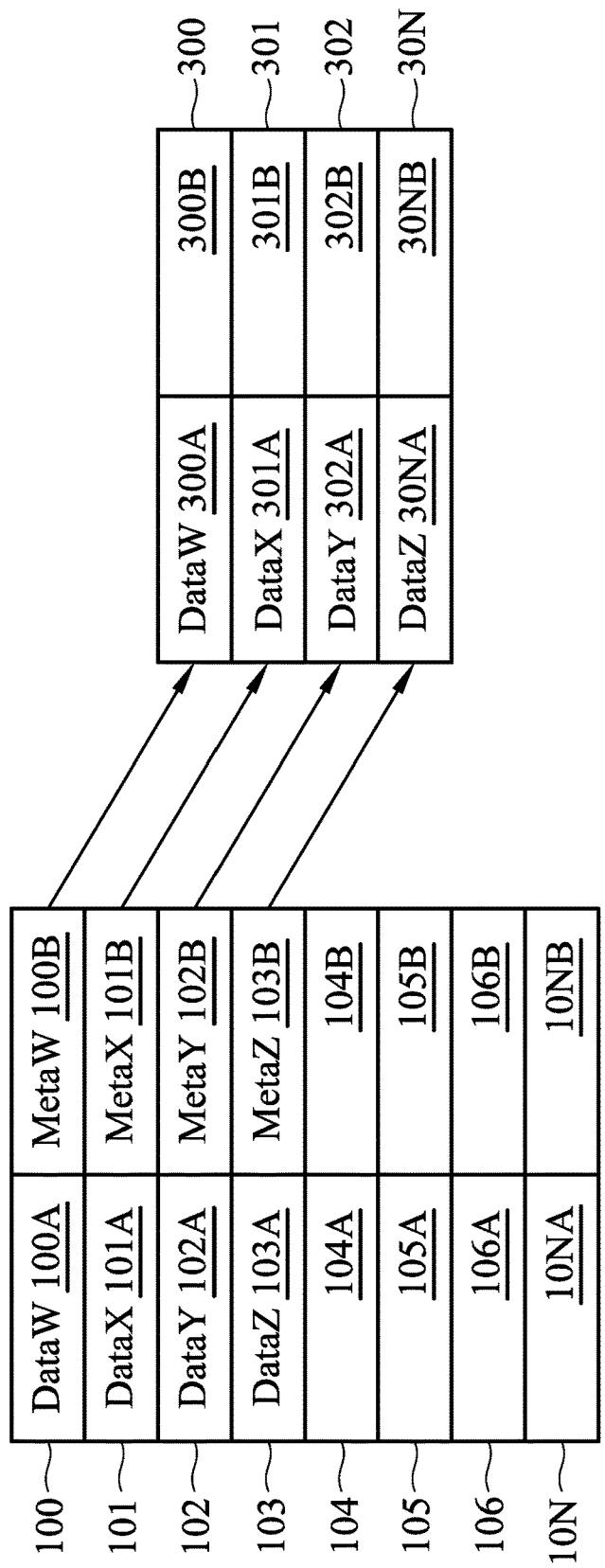
FIGS. 2A and 2B are schematic diagrams showing the programming of the memory system according to one embodiment of the present invention.
Figure 2B:
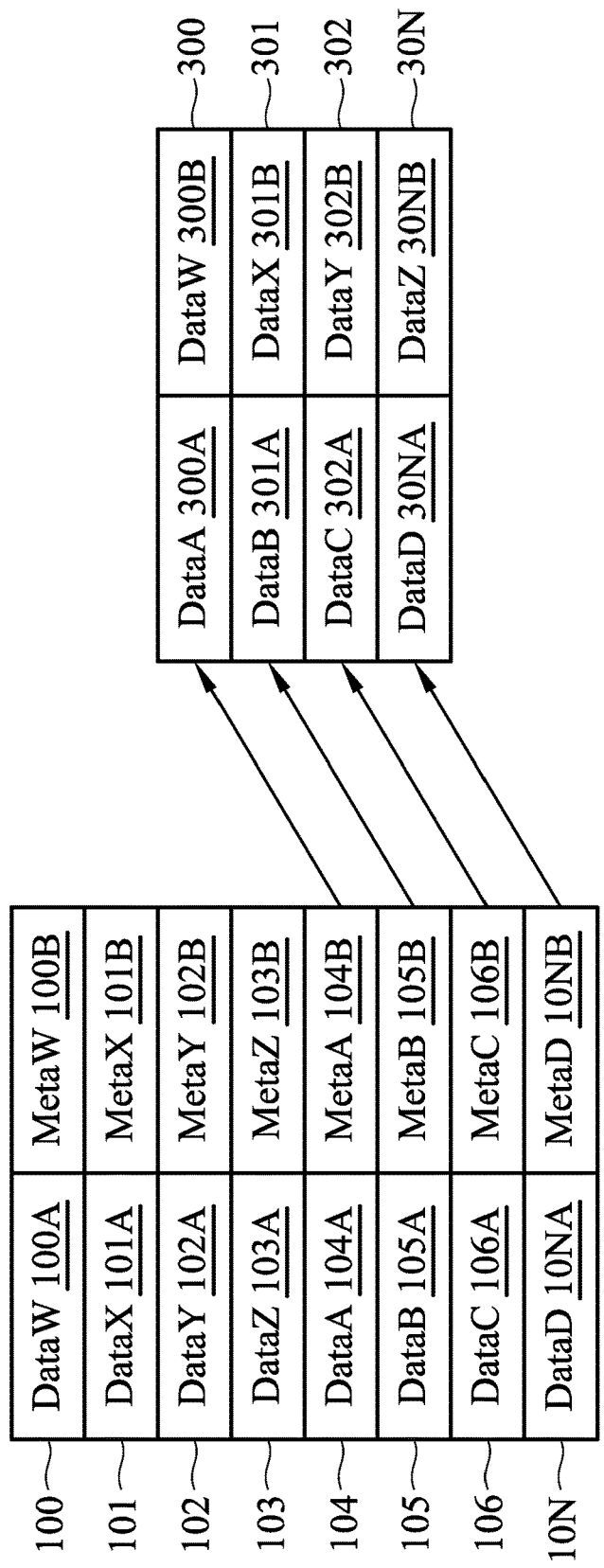

FIGS. 2A and 2B are schematic diagrams showing the programming of the memory system 10 according to one embodiment of the present invention. On the one hand, as shown in FIG. 2A, data DataW and MetaW are stored in the memory regions 100A and 100B of the first memory 100, data DataX and MetaX are stored in the memory regions 101A and 101B of the first memory 101, data DataY and MetaY are stored in the memory regions 102A and 102B of the first memory 102, and data DataZ and MetaZ are stored in the memory regions 103A and 103B of the first memory 103. On the other hand, there are no data stored in the first memories 104, 105, 106 and 10N. Afterwards, the data DataW, DataX, DataY and DataZ are programmed to the memory regions 300A, 301A, 302A and 30NA of the second memories 300, 301, 302 and 30N respectively. At the same time, the memory regions 300B, 301B, 302B and 30NB of the second memories 300, 301, 302 and 30N are still empty and are not programmed with any data. Specifically, the memory regions 300A, 301A, 302A and 30NA are buffer memories, and the memory regions 300B, 301B, 302B and 30NB are cache memories. It should be noted that even the data DataW, DataX, DataY and DataZ are programmed to the second memories 300, 301, 302 and 30N, the data DataW, DataX, DataY and DataZ are still stored in the first memories 100, 101, 102 and 103 until the programming is checked to be successful.

Afterwards, as shown in FIG. 2B, the data DataA is stored in the memory region 104A and programmed to the memory region 300A of the second memory 300, the data DataB is stored in the memory region 105A and programmed to the memory region 301A of the second memory 301, the data DataC is stored in the memory region 106A and programmed to the memory region 302A of the second memory 302, and the data DataD is stored in the memory region 10NA and programmed to the memory region 30NA of the second memory 30N. In addition, the data DataW, DataX, DataY and DataZ are transferred from the memory regions 300A, 301A, 302A and 30NA to the memory regions 300B, 301B, 302B and 30NB respectively.

The detailed contents of the programming status of the memory system 10 are illustrated in Table 1.

TABLE 1

|  | Memory 300 | Memory 301 | Memory 302 | Memory 30N |
|---|---|---|---|---|
| Block | 0xA | 0xA | 0xA | 0xA |
| Buffer | Memory 104 (DataA) | Memory 105 (DataB) | Memory 106 (DataC) | Memory 10N (DataD) |
| Cache | Memory 100 (DataW) | Memory 101 (DataX) | Memory 102 (DataY) | Memory 103 (DataZ) |

The programming status as shown in Table 1 corresponds to the embodiments of FIG. 2A and FIG. 2B. According to the programming status of Table 1, the memory regions 300A (Buffer) and 300B (Cache) of the second memory 300 store the data DataA and DataW which are programmed from the first memories 104 and 100. The memory regions 301A and 301B of the second memory 301 store the data DataB and DataX which are programmed from the first memories 105 and 101. The memory regions 302A and 302B of the second memory 302 store the data DataC and DataY which are programmed from the first memories 106 and 102. The memory regions 30NA and 30NB of the second memory 30N store the data DataD and DataZ which are programmed from the first memories 10N and 103.

In one embodiment, when additional data is going to be written to the at least one first memory 100~10N where the data is programmed from, the programming status is inquired to check whether the programming of the data is successful or not, and the additional data is different from the data. For example, an additional data DataT which is different from the data DataW is going to be written to the first memory 100, and the controller 200 inquires the programming status to check whether the programming of the data is successful or not. When the programming of the data is successful, the additional DataT is written to the first memory 100 where the data DataW is programmed from previously. When the programming of the data is not successful, the additional DataT would not be written to the first memory 100, and the first memory 100 keeps storing the data DataW until the programming of the data DataW is successful. It should be noted that the programming status would be updated as soon as it is inquired.

The updated contents of the programming status of the memory system 10 are illustrated in Table 2.

TABLE 2

|  | Memory 300 | Memory 301 | Memory 302 | Memory 30N |
| --- | --- | --- | --- | --- |
| Block | 0xA | 0xA | 0xA | 0xA |
| Buffer | Memory 104 (DataA) | Memory 105 (DataB) | Memory 106 (DataC) | Memory 10N (DataD) |
| Cache | Pass | Memory 101 (DataX) | Memory 102 (DataY) | Memory 103 (DataZ) |

For example, since the programming of DataW to the memory region 300B (Cache) is successful, the programming status is updated as shown in Table 2. Accordingly, when the memory region 300B of the second memory 300 or the first memory 100 is going to be accessed or implemented, there is no need for the controller 200 to issue a command to check the status of the first memory 100 or the second memory 300. Therefore, the efficiency of the memory system 10 could be improved by updating the programming status instantly and dynamically.

After recording and checking the programming status, there are several methods of handling the programming status according to the specification and the algorithm of the second memories 300~30N. In one embodiment, the programming status of the cache memory (for example, the memory region 300B of the second memory 300) is inquired when the data is programmed to the cache memory. The programming status of the cache memory and the buffer memory (for example, the memory region 300A of the second memory 300) are inquired when the data is programmed to the buffer memory. In another embodiment as shown in FIGS. 2A & 2B, the data DataW is programmed to the second memory 300, then the data DataA is programmed to the second memory 300. When the later data DataA is programmed to the same second memory 300 and the same block as the previous data DataW, only the programming status of the cache memory needs to be inquired. When the later data is not programmed to the same second memory and the same block as the previous data, the programming status of both the cache memory and the buffer memory need to be inquired. Specifically, it takes more access time for inquiring both the cache memory and the buffer memory than inquiring only the cache memory. The memory-control method of the present invention provides an adjustable and flexible inquiring method for handling the programming status to reduce the access time and improve the efficiency. In another embodiment, when an additional data is going to be written to a first memory which has not been used before, the programming status would not be checked to save more time.

In one embodiment, when the data is going to be read from the at least one second memory 300~30N where the data is programmed to, the programming status is inquired to check whether the programming of the data was successful or not. On the one hand, the data of the at least one second memory 300~30N where the data is programmed to is read when the programming of the data is successful. On the other hand, when the programming of the data is not successful, the data of the at least one second memory 300~30N where the data is programmed to is not read, and the at least one first memory 100~10N where the data is programmed from still stores the data. Furthermore, the programming status of the cache memory and the buffer memory of the second memory 300~30N are inquired because the data stored by the second memory 300~30N is going to be read.

Figure 3A:
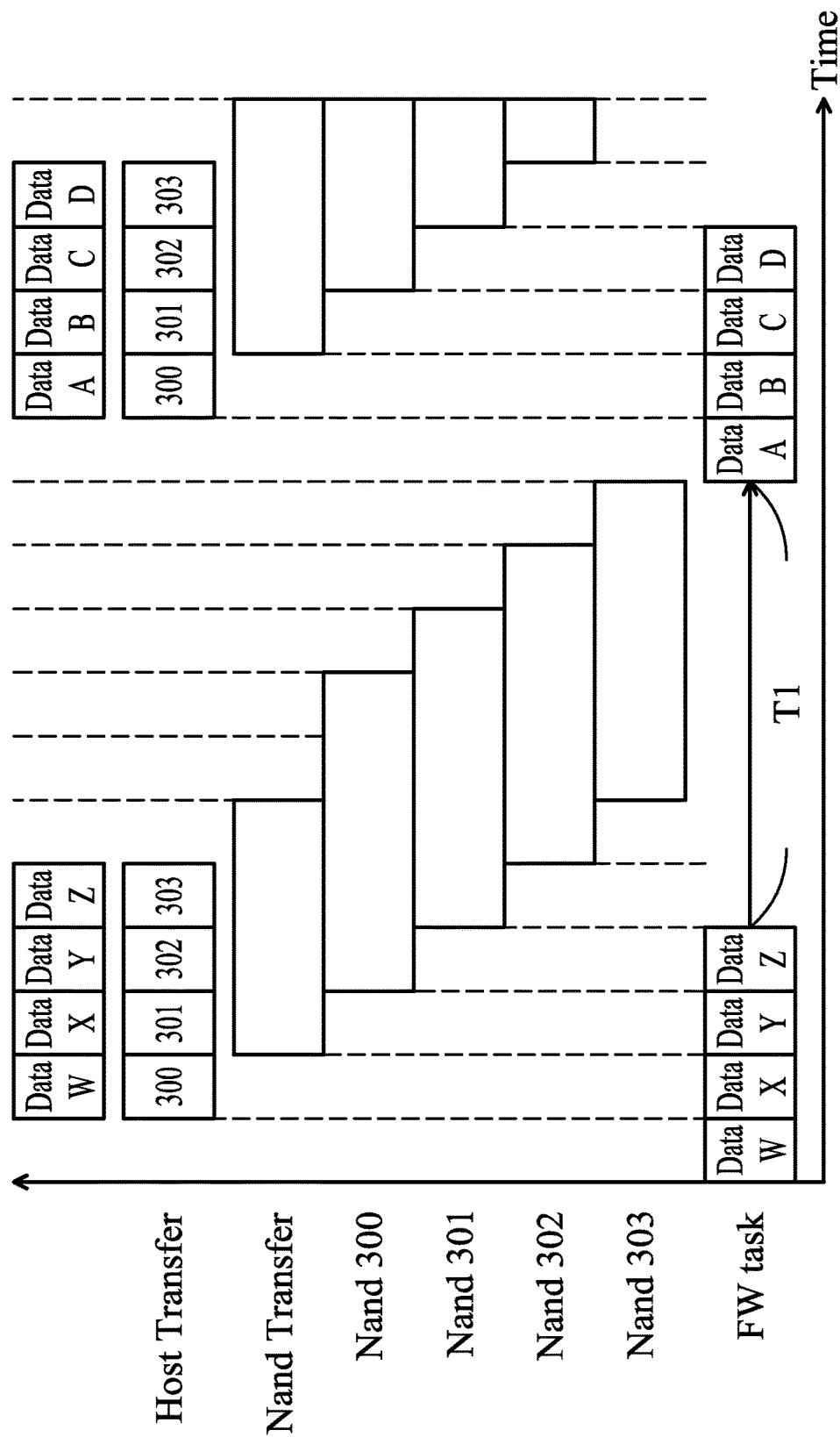
FIG. 3A is a schematic diagram showing the programming of a sequential write of the prior art.
Figure 3B:
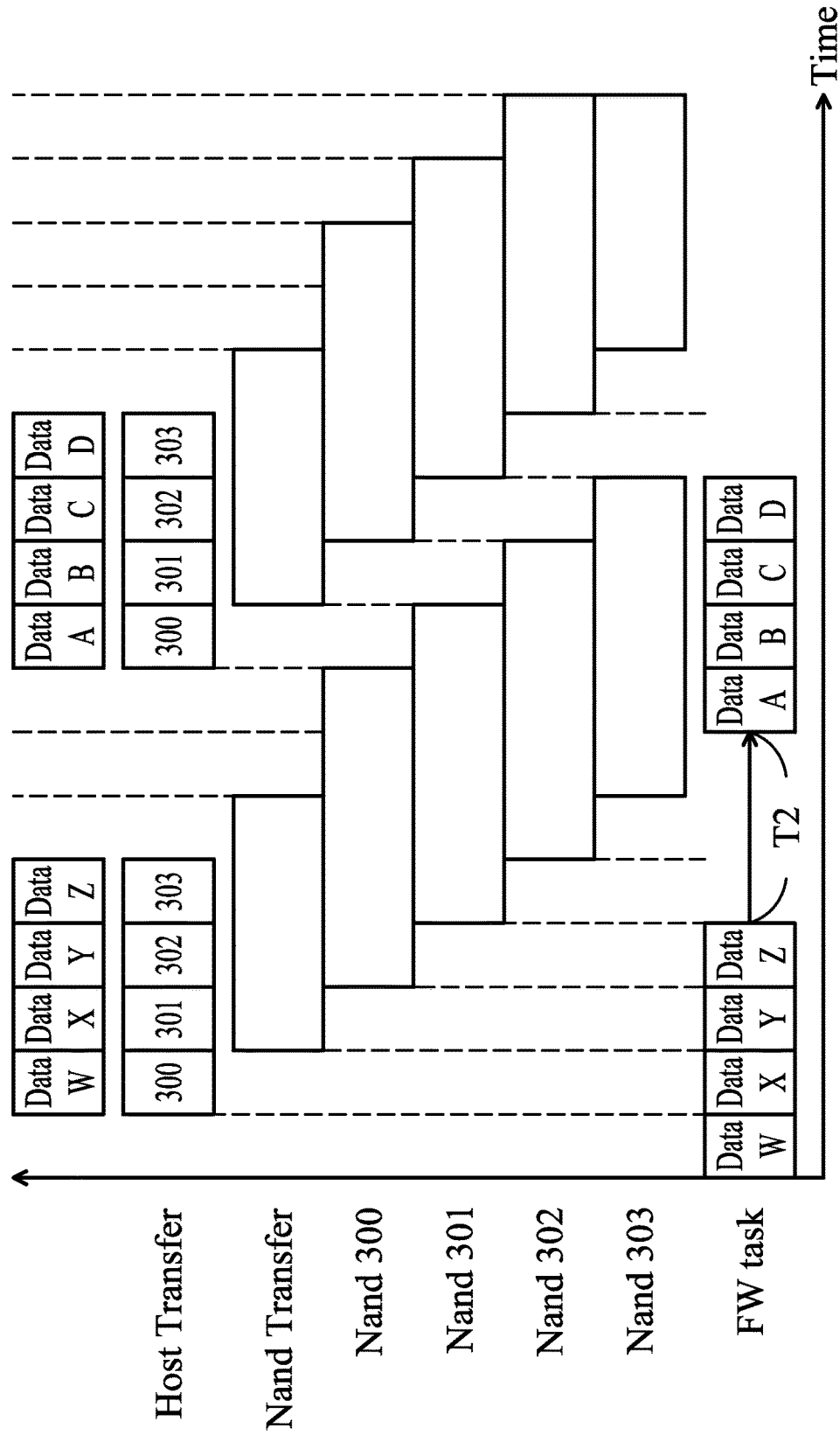
FIG. 3B is a schematic diagram showing the programming of a sequential write according to one embodiment of the present invention.

FIG. 3A is a schematic diagram showing the programming of sequential write of the prior art. As shown in FIG. 3A, the data DataW, DataX, DataY and DataZ are written to the second memories (NANDs) 300~303 sequentially. After the firmware (FW) executes the sequential writing of data DataW, DataX, DataY and DataZ with the host transfer and the NAND transfer, it waits for a waiting time T1 and executes another sequential writing of the data DataA, DataB, DataC and DataD by checking the programming status as soon as the writing or programming is finished. FIG. 3B is a schematic diagram showing the programming of sequential write according to one embodiment of the present invention. The firmware checks the programming status before implementing the second memory 300~303 rather than checking the programming status as soon as the writing or programming is finished. Therefore, the waiting time T2 of FIG. 3B is shorter than the waiting time T1 of FIG. 3A, and a higher performance is achieved.

Figure 4A:
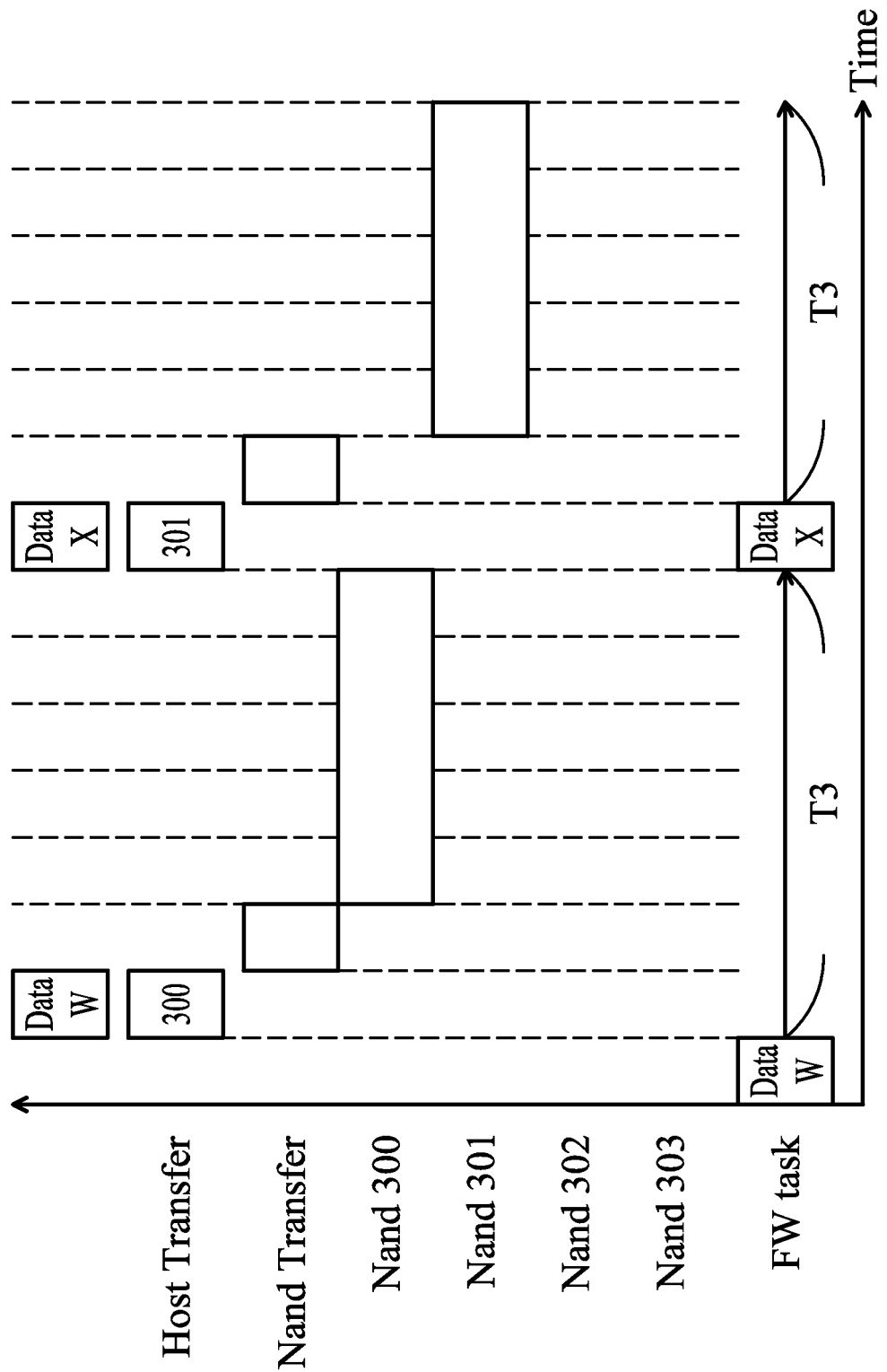
FIG. 4A is a schematic diagram showing the programming of a random write of the prior art.
Figure 4B:
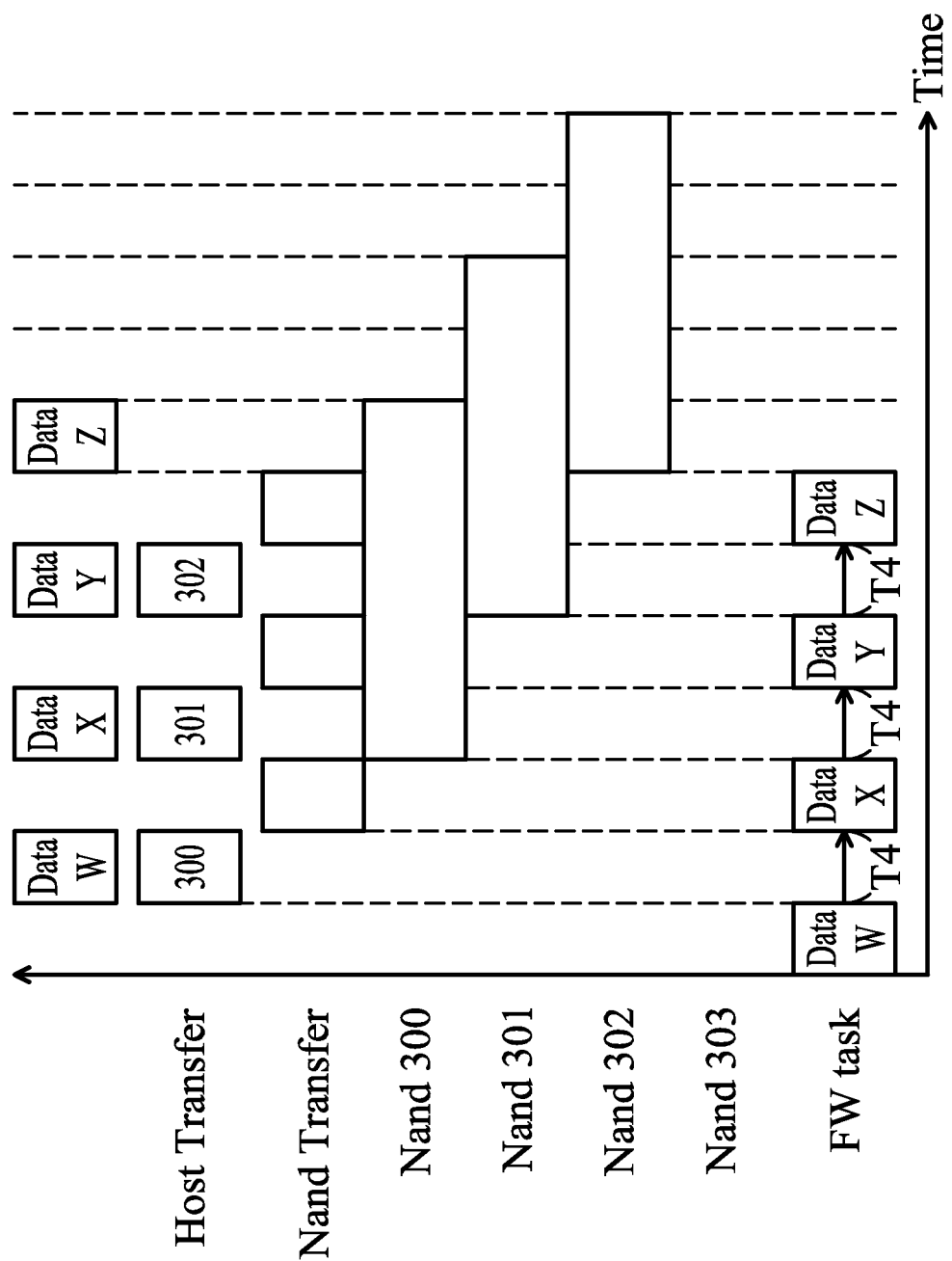
FIG. 4B is a schematic diagram showing the programming of a random write according to one embodiment of the present invention.

FIG. 4A is a schematic diagram showing the programming of random write of the prior art, and FIG. 4B is a schematic diagram showing the programming of random write according to one embodiment of the present invention. The data DataW, DataX, DataY and DataZ are written to the second memories 300~303 randomly. As shown in FIGS. 4A & 4B, the waiting time T4 of FIG. 4B is shorter than the waiting time T3 of FIG. 4A because the firmware checks the programming status before implementing the second memory 300~303 rather than checking the programming status as soon as the writing or programming is finished.

Figure 5:
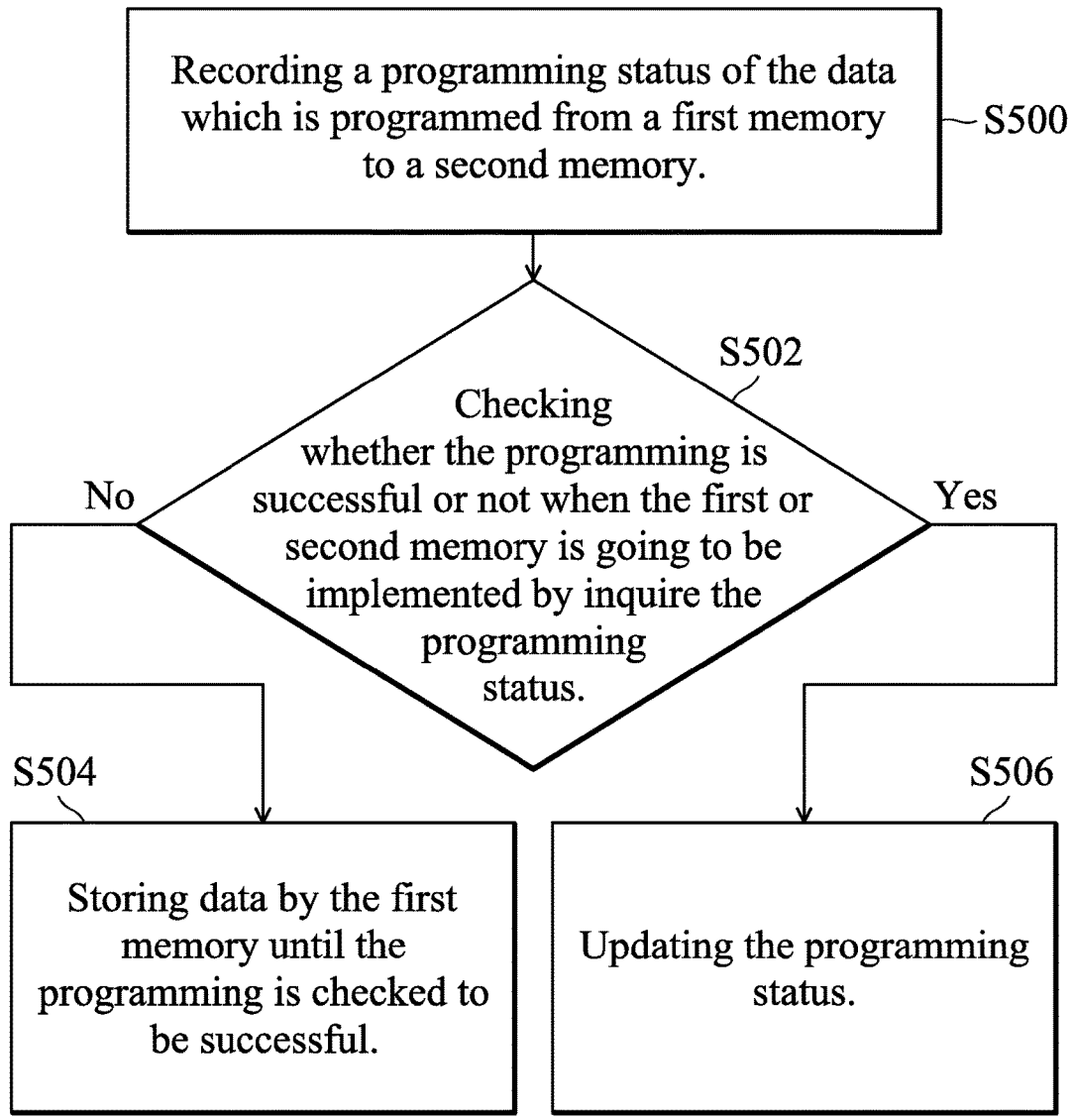
FIG. 5 is a flow chart of the memory-control method according to one embodiment of the present invention.

FIG. 5 is a flow chart of the memory-control method according to one embodiment of the present invention. In step S500, a programming status of the data which is programmed from a first memory to a second memory is recorded. Afterwards, in step S502, whether the programming is successful or not is checked or inspected when the first or second memory is going to be implemented by inquiring the programming status. If the programming is not successful, step S504 is performed that the data is stored by the first memory until the programming is checked to be successful. If the programming is successful, step S506 is performed that the programming status is updated. The detailed descriptions about the recording, inquiring and handling of the programming status have been illustrated before, and are not repeated.

Although embodiments of the present disclosure and their advantages has been described in detail, it should be understood that various changes, substitutions and alterations can be made herein without departing from the spirit and scope of the disclosure as defined by the appended claims. As one of ordinary skill in the art will readily appreciate from the disclosure of the present disclosure, processes, machines, manufacture, compositions of matter, means, methods, or steps, presently existing or later to be developed, that execute substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A memory system with a programming status, comprising:
    at least one first memory, wherein each of the at least one first memory comprises a plurality of memory regions to store data;
    at least one second memory, wherein each of the at least one second memory comprises a plurality of memory regions for programming the data from the at least one first memory, and the at least one second memory is a flash memory; and
    a controller, coupled to the second memory and utilized to record a programming status of the data, wherein the controller checks whether the programming is successful or not by inquiring the programming status in response to the at least one first memory or the at least one second memory being going to be accessed, and the at least one first memory stores the data until the programming is checked to be successful.

2. The memory system with a programming status as claimed in claim 1, wherein the programming status comprises information about the data, information about the at least one first memory and its memory region where the data is programmed from, and information about the at least one second memory and its memory region where the data is programmed to.

3. The memory system with a programming status as claimed in claim 2, wherein the programming status is updated when the at least one first memory or the at least one second memory has been accessed or when the programming status has been inquired.

4. The memory system with a programming status as claimed in claim 1, wherein each of the at least one second memory comprises a second buffer memory and a second cache memory.

5. The memory system with a programming status as claimed in claim 4, wherein when additional data is going to be written to the at least one first memory where the data is programmed from, the programming status is inquired to check whether the programming of the data is successful or not, and the additional data is different from the data.

6. The memory system with a programming status as claimed in claim 5, wherein the at least one first memory where the data is programmed from is written with the additional data when the programming of the data is successful, and the at least one first memory where the data is programmed from is not written with the additional data and stores the data when the programming of the data is not successful.

7. The memory system with a programming status as claimed in claim 5, wherein the programming status of the second cache memory is inquired when the data is programmed to the second cache memory, and the programming status of the second cache memory and the second buffer memory are inquired when the data is programmed to the second buffer memory.

8. The memory system with a programming status as claimed in claim 4, wherein when the data is going to be read from the at least one second memory where the data is programmed to, the programming status is inquired to check whether the programming of the data is successful or not.

9. The memory system with a programming status as claimed in claim 7, wherein the data of the at least one second memory where the data is programmed to is read when the programming of the data is successful, and the data of the at least one second memory where the data is programmed to is not read and the at least one first memory where the data is programmed from stores the data when the programming of the data is not successful.

10. The memory system with a programming status as claimed in claim 8, wherein the programming status of the second cache memory and the second buffer memory are inquired.

11. A memory-control method with a programming status, comprising:
    recording a programming status of the data which is programmed from at least one first memory to at least one second memory being a flash memory;
    requiring, by a controller, to check whether the programming is successful or not by inquiring the programming status in response to the at least one first memory or the at least one second memory being going to be accessed; and
    storing the data in the at least one first memory until the programming is checked to be successful.

12. The memory-control method with a programming status as claimed in claim 11, wherein the programming status comprises information about the data, information about the at least one first memory and its memory region where the data is programmed from, and information about the at least one second memory and its memory region where the data is programmed to.

13. The memory-control method with a programming status as claimed in claim 12, further comprising updating the programming status when the at least one first memory or the at least one second memory has been accessed or when the programming status has been inquired.

14. The memory-control method with a programming status as claimed in claim 12, wherein each of the at least one second memory comprises a second buffer memory and a second cache memory.

15. The memory-control method with a programming status as claimed in claim 14, further comprising when additional data different from the data is going to be written to the at least one first memory where the data is programmed from, inquiring the programming status to check whether the programming of the data is successful or not.

16. The memory-control method with a programming status as claimed in claim 15, further comprising writing the additional data to the at least one first memory where the data is programmed from when the programming of the data is successful, and not writing the additional data to the at least one first memory where the data is programmed from and storing the data by the at least one first memory where the data is programmed from when the programming of the data is not successful.

17. The memory-control method with a programming status as claimed in claim 15, further comprising inquiring the programming status of the second cache memory when the data is programmed to the second cache memory, and inquiring the programming status of the second cache memory and the second buffer memory when the data is programmed to the second buffer memory.

18. The memory-control method with a programming status as claimed in claim 14, further comprising when the data is going to be read from the at least one second memory where the data is programmed to, inquiring the programming status to check whether the programming of the data is successful or not.

19. The memory-control method with a programming status as claimed in claim 17, further comprising reading the data of the at least one second memory where the data is programmed to when the programming of the data is successful, and not reading the data of the at least one second memory where the data is programmed to and storing the data by the at least one first memory where the data is programmed from when the programming of the data is not successful.

20. The memory-control method with a programming status as claimed in claim 18, further comprising inquiring the programming status of the second cache memory and the second buffer memory.

* * * * *